United States Patent [19]

Gonda

[11] Patent Number: 4,924,195
[45] Date of Patent: May 8, 1990

[54] CRYSTAL OSCILLATOR WITH BROAD TUNING CAPABILITY

[75] Inventor: Joseph Gonda, Moultonboro, N.H.

[73] Assignee: AT&T Bell Laboratories, Murray Hill, N.J.

[21] Appl. No.: 368,691

[22] Filed: Jun. 19, 1989

[51] Int. Cl.$^5$ .............................................. H03B 5/36
[52] U.S. Cl. ........................... 331/116 R; 331/107 A; 331/176; 331/177 V
[58] Field of Search ........ 331/107 A, 116 R, 116 FE, 331/158, 176, 177 V

[56] References Cited

U.S. PATENT DOCUMENTS 3,995,233 11/1976 Waku .............................. 331/116 R

OTHER PUBLICATIONS

M. E. Frerking "Crystal Oscillator Design and Temperature Compensation", 1978 Van Nostrand Reinhold, pp 56–58, 72–73, 89–90, 122–124.
B. Parzen "Design of Crystal and Other Harmonic Oscillators", 1983 John Wyley and Sons, pp. 92–95, 100–102, 125–127.
T. O'Shea at al. "Precision L-Band SAW Oscillator for Satellite Application", SAWTEK Incorporated.

*Primary Examiner*—Siegfried H. Grimm
*Attorney, Agent, or Firm*—Joseph A. Cameron

[57] ABSTRACT

A first transistor is connected in grounded-collector-emitter-follower configuration to generate a high enough negative resistance to overcome the oscillating resistance of the crystal resonator connected to the base electrode. A second transistor connected in grounded-base configuration serves as a buffer and impedance transformer between the low impedance output of the first transistor and the high impedance of a load. An inductor connected between the resonator and the first transistor input and a variable capacitance approximating the shunt capacitance of the resonator connected across the first transitor input form an impedance inverter which absorbs the resonator shunt capacitance and converts the effect of the resonator to a parallel tuned circuit that can be broadly tuned.

10 Claims, 2 Drawing Sheets

CRYSTAL OSCILLATOR WITH BROAD TUNING CAPABILITY

FIELD OF THE INVENTION

Crystal controlled oscillators of both bulk wave and surface acoustic wave.

BACKGROUND OF THE INVENTION

One problem often encountered in the manufacture of crystal controlled oscillators in the HF to UHF frequency band is that some of the oscillators will not start under all of the specified operating conditions. This has been the case with oscillators of all three of the common configurations, Colpitts, Clapp and Pierce. To insure reliable starting, manufacturers of the oscillators have resorted to testing the oscillators at temperature extremes to reject non starters, or to specially selecting the crystal resonators, the transistors, or both. Obviously it is desirable, if possible, to eliminate the expense of these procedures.

The apparent reason for poor starting is that negative resistance generated by the particular transistor amplifier at small signals is not great enough to overcome the oscillating resistance of the crystal resonator. The sum of the two resistances must be no greater than zero for the oscillator to start.

It is well known that the resonator oscillating resistance is a function of the electrode structure used to launch the acoustic waves. Unfortunately, however, structural changes that tend to lower the oscillating resistance, at the same time increase the inter-electrode capacitance. This capacitance shunts the series resonant circuit of the resonator and limits the range of frequency through which the resonator can be "pulled." In fact, the ratio of the series resonant capacitance to the shunt capacitance is sometimes referred to as a figure of merit for tunability of the resonator. This ratio is particularly low in the case of surface acoustic wave (SAW) resonators.

As a result of the unfortunate tradeoff between oscillating resistance and shunt capacitance, in addition to starting problems, crystal controlled oscillators in these frequency bands normally have very narrow pull ranges. Where variable frequency is needed, such as in a phase-locked loop, known circuits are unable to take advantage of the high Q that comes with operating a crystal resonator at resonance. They use the resonator either as a reactive component or as a delay line. This usually results in low Q and substantial oscillator noise.

An object of my invention is a crystal controlled oscillator with reliable starting that can be manufactured without special product or component selection.

Another object of my invention is a variable frequency crystal controlled oscillator with a wide pull range and very low noise because the crystal resonator operates at resonance.

SUMMARY OF THE INVENTION

To overcome starting problems, a first transistor is connected in grounded collector-emitter-follower configuration to provide a relatively high impedance input at its base electrode for connection to the crystal resonator and a relatively low impedance output at its emitter electrode. A second transistor connected as a buffer in grounded base configuration has a relatively low impedance input connected to the first transistor output and a relatively high impedance output for connection to a load.

An impedance inverter comprising an inductor connected between the resonator and the high impedance transistor input and a variable capacitance connected across the high impedance input, the capacitance value of which approximates the shunt capacitance of the crystal resonator absorbs the shunt capacitance of the crystal resonator and converts the effect of the resonator from a series resonant circuit to a parallel resonant circuit that can be broadly tuned.

DETAILED DESCRIPTION

Figure 1:
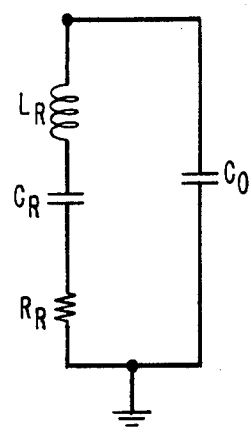
FIG. 1 is generally accepted equivalent circuit of a crystal resonator.

Theory of operation:

Referring to the equivalent circuit of a crystal resonator, FIG. 1, the crystal element may be represented at resonance by the series combination of $L_R$ $C_R$ and $R_R$ shunted by interelectrode capacitance $C_o$.

For a typical crystal resonator operating in the HF to UHF frequency range, of either bulk or surface acoustic wave (SAW) variety, the oscillating resistance $R_R$ is relatively high between about 20 and 60 ohms. In a typical Pierce, Colpitts or Clapp oscillator circuit, on the other hand, the negative resistance facing the crystal resonator at low signal amplitude is relatively low. Typical values fall in the range of 20 to 50 ohms. This basic incompatibility between the range of resonator operating resistance and developed negative resistance explains the starting difficulties.

In accordance with my invention the small signal developed negative resistance can be substantially increased if the oscillator transistor is connected in grounded collector, emitter follower connection. This results, however, in such a low output impedance that the circuit will not oscillate with a 50 ohm load. As a consequence, also in accordance with my invention, a second transistor is used as a buffer to present an output impedance to match the load. Negative resistances in the order of 100 ohms are thereby available to eliminate the starting problem.

With the availability of such high negative resistance, the pulling range restriction can also be greatly ameliorated. Consider again the shunt capacitance $C_o$ of the crystal resonator, FIG. 1. If it were not for $C_o$, additional capacitance added in series with the resonator would have the effect of reducing $C_R$, thereby changing the resonant frequency. The only degradation to the quality factor Q of the circuit would be due to the resistance of the added variable capacitor. The presence of $C_o$, however, prevents such simple addition.

Figure 2:
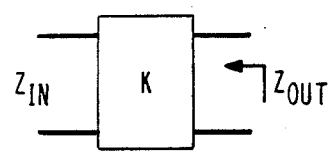
FIG. 2 is a simple block representation of an impedance inverter used in the invention.

Consider, however, an impedance inverter, shown in FIG. 2, in which, by definition $$Z_{out} = \frac{K^2}{Z_{in}}.$$

If a crystal resonator were connected to the input terminals of the impedance inverter, it would look from the output like a parallel RLC circuit instead of the series RLC circuit of FIG. 1.

Figure 3:
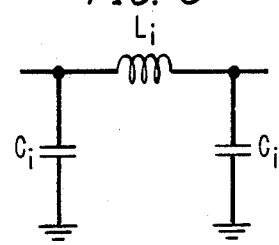
FIG. 3 is a diagram of a simple pi section useful in explaining the operation of part of the invention.

In theory, an impedance inverter in the form of a pi circuit with an inductance series arm would have to have negative inductance shunt arms. Fortunately, however, crystal oscillators are very narrow band devices, even those regarded as "broadly tunable". A very suitable approximation of the theoretical impedance inverter for narrow band operation can be made using real passive components. The pi section shown in FIG. 3, in which $L_i$ is the value of series inductance and $C_i$ the value of shunt capacitance will perform impedance inversion at a frequency $f_o$, when the following equation is satisfied:

$$2 \pi f_o L_i = \frac{1}{2 \pi f_o C_i},$$

which incidentally = K.

Furthermore, in accordance with the invention, the troublesome capacitance $C_o$ can become the inverter input shunt capacitance $C_i$, making it virtually disappear. The series resonant circuit that represents the crystal resonator now appears as a parallel resonant circuit at the output of the impedance inverter. Slight changes in the output inverter capacitance $C_i$ add directly to the parallel capacitance due to the crystal resonator to directly change the resonant frequency. The result is a significantly improved crystal oscillator circuit whose frequency can be varied over a relatively wide range with very little added noise or loss of stability.

Figure 4:
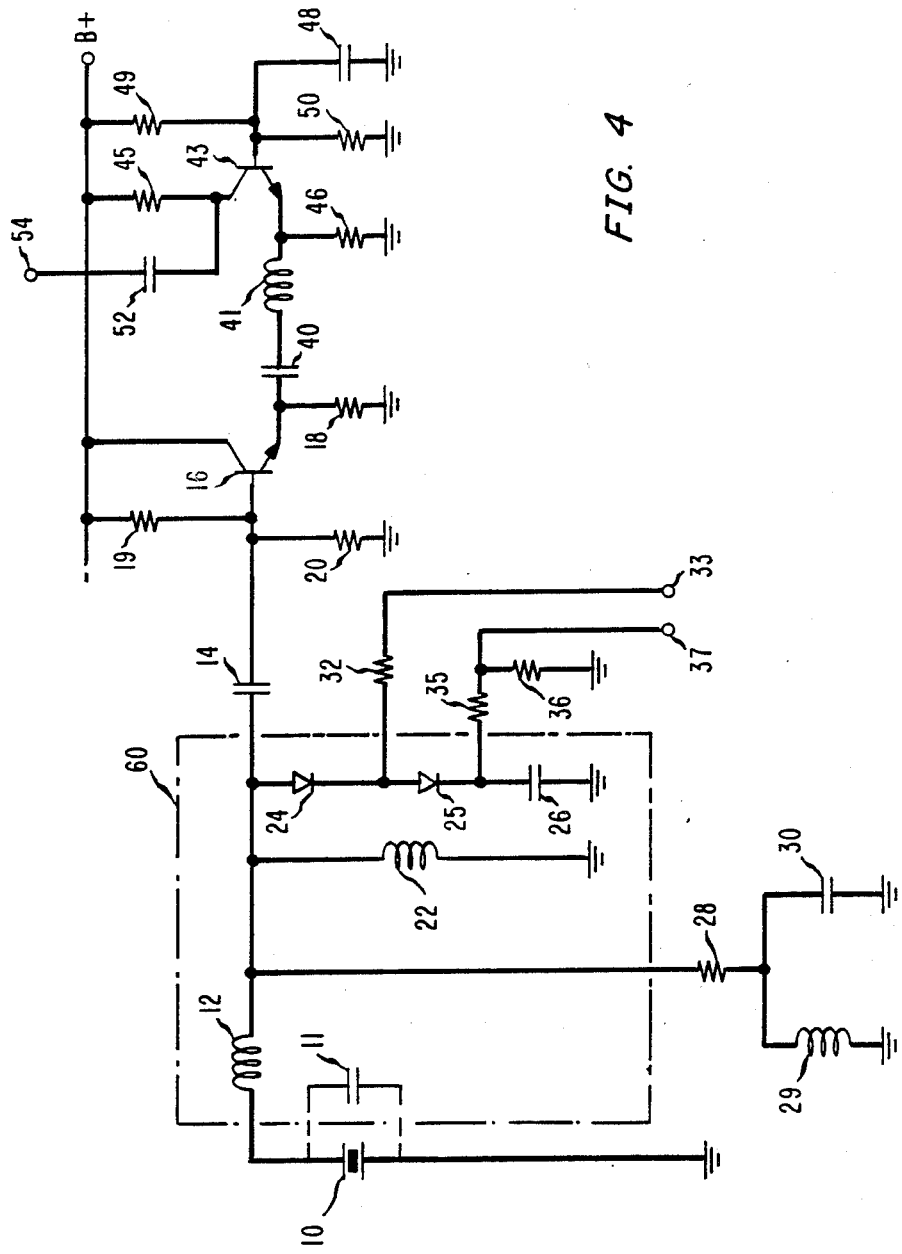
FIG. 4 is a particularly useful variable frequency embodiment of the invention.

A particularly useful embodiment of the invention is shown in the schematic diagram of FIG. 4, which may, for example be a SAW oscillator operating in the vicinity of 600 MHz. One side of a SAW resonator 10 is connected to ground; the other end is connected via an inductor 12 and a coupling capacitor to the base of a transistor 16. The inherent shunt parallel parasitic capacitance of SAW resonator 10 is shown as capacitor 11. The collector of transistor 16 is connected to a source of operation voltage B+, and the emitter is connected through a resistor 18 to ground. Biasing resistors 19 and 20 connect the base of transistor 16 to B+ and ground, respectively. The junction between inductor 12 and capacitor 14 is shunted to ground via several paths. One path is an inductance 22. A second path is the series combination of two varactor diodes 24 and 25, respectively and a capacitor 26. A third path includes a resistor 28 in series with the parallel combination of an inductor 29 and capacitor 30. The junction between varactor diodes 24 and 25 may be connected via a resistor 32 to a source of temperature compensating voltage 33, and the junction between varactor diode 25 and capacitor 26 may be connected via a voltage divider made up of resistors 35 and 36 to a frequency control voltage source 37.

The emitter of transistor 16 may be connected via the series combination of a capacitor 40 and an inductor 41 to the emitter of a second transistor 43. The collector of transistor 43 is connected to operating voltage B+ via a resistor 45, and the emitter is connected to ground via a resistor 46. A capacitor 48 connects the base of transistor 43 to ground, and a pair of biasing resistors 49 and 50 connect it to B+ and ground, respectively. Finally, a coupling capacitor 52 connects the collector of transistor 43 to the oscillator output terminal 54.

To understand the operation and therefore the design considerations of the variable frequency oscillator of FIG. 4, consider the following:

The emitter-follower configuration of bipolar transistor 16 has a high input impedance. With a low impedance capacitive load connected to the emitter, transistor 16 generates about 150 ohms negative resistance facing the crystal resonator 10, enough to insure excellent starting characteristics without special selection of resonators or transistors. Biasing resistors 19 and 20 are at least an order of magnitude above this level to avoid substantially affecting it.

Transistor 43 acts as an impedance-transforming buffer. Its low input impedance looking into the emitter supplies the low impedance load for transistor 16.

Collector resistor 45 has a high enough resistance to allow the oscillator circuit to drive a load connected to output 54 of usually, but not necessarily, about 50 ohms. Capacitor 48 provides ac ground for the base electrode. In the embodiment, emitter resistor 18 is intentionally not bypassed in order to provide dc negative feedback to reduce low frequency noise.

Capacitor 40 and inductor 41, which couple the two oscillator transistors, form a series tuned circuit slightly above the operating frequency. This tuned circuit provides unimpeded coupling at the operating frequency and helps prevent spurious frequencies.

Resonator shunt capacitance 11, series inductor 12, and the shunt paths of inductor 22 and the series combination of varactor diodes 24 and 25 and capacitor 26 form an impedance inverter 60 in accordance with the invention. The shunt leg comprising elements 22, 24, 25 and 26, therefore, at the operating frequency represents a capacitance equal to the resonator parasitic shunt capacitance 11. The inductance of inductor 12 is therefore chosen to satisfy the relationship $$2 \pi f_o L_{12} = \frac{1}{2 \pi f_o C_{11}}.$$

where $L_{12}$ is the inductance to inductor 12 and $C_{11}$ is capacitance 11. Capacitor 26 is added in series with variable capacitance 25, in accordance with common practice to lower the slope of the varactor characteristic and make tuning more linear. Resistors 35 and 36 are chosen to set the optimum operating point of varactor diode 25. Matching varactor diode 24 is connected in series with diode 25, and temperature compensating voltage may be injected at the junction via input 33 and resistor 32, again in accordance with common practice. Since the two shunt arms of the pi configured impedance inverter 60 must present the same impedance, inductor 22 is added in parallel with the two diodes and capacitor 26 to match the resonator parasitic shunt capacitance, $C_{11}$.

The use of impedance inverter 60, in making the resonator look like a parallel tuned circuit, also makes it more likely to oscillate at spurious frequencies. Inductor 29 and capacitor 30 are chosen to provide parallel resonance at the oscillator operating frequency. They therefore represent an open circuit over the operating range and a low impedance, limited by the value of resistor 28, to dampen and thereby prevent oscillation outside the desired range.

Figure 5:
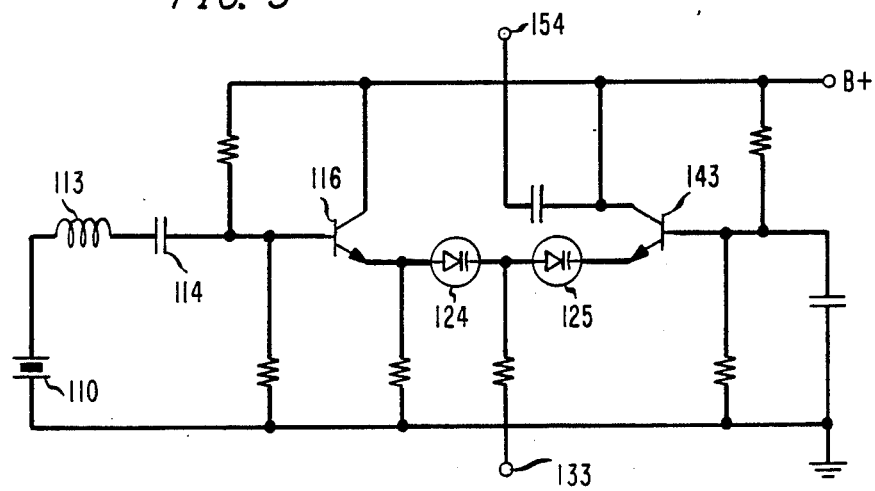
FIG. 5 is a useful fixed frequency embodiment of the invention.

The particular embodiment shown in FIG. 4 using a SAW resonator operating at 622 MHz has demonstrated a frequency pull range in excess of 500 KHz and a phase noise level of better than −95 dBc at 1 KHz away from the carrier.

Where a fixed frequency temperature compensated oscillator is desired, the circuit of FIG. 5 can be very useful. In this figure, the components which are similar to those in the embodiment of FIG. 4 have similar identifying numbers preceded by the prefix 1. Transistor 116 is therefore connected as a grounded-collector emitter-follower and transistor 143 as an impedance-transformer buffer to provide reliable starting. In this case, since a wide tuning range is not desired, an impedance inverter need not be included. Inductor 113 is actually a small inductance to tune out the capacitive impedance generated by the transistor circuit. The two varactor diodes for temperature compensation, 124 and 125, may be connected between transistor emitters, with the compensating voltage injected between them from input 133.

I have thus described a novel construction for crystal oscillators of both fixed and variable frequency types, which eliminate the common starting problem. In addition, the variable frequency variety operates over a broad tuning range without operating the crystal out of resonance, but by shifting the resonance.

It will be obvious to those skilled in oscillator design that many modifications of the embodiments described may be made without departing from the spirit and the scope of my invention.

I claim:

1. A crystal controlled oscillator comprising:
   a first transistor connected in grounded collector-emitter-follower configuration to provide a relatively high impedance input as its base electrode and a relatively low impedance output at its emitter electrode;
   a crystal resonator connected to said high impedance input, and
   a second transistor connected as a buffer amplifier in a grounded base configuration having a relatively low impedance input connected to said first transistor low impedance output and a relatively high impedance output for connection to a load.

2. A crystal controlled oscillator, as in claim 1, wherein said connection between said crystal resonator and said high impedance input includes inductance means.

3. A crystal controlled oscillator, as in claim 2, wherein said connection between said first and second transistors comprises two varactor diodes connected in series and further comprising temperature compensating voltage input means connected to the junction between said diodes for receiving a voltage to reduce changes in the frequency of said oscillator due to changes in operating temperature.

4. A crystal controlled oscillator, as in claim 2, wherein said first transistor low impedance output comprises unbypassed emitter resistance means to reduce low frequency noise.

5. A crystal controlled oscillator, as in claim 1, further comprising impedance inverting means connected between said crystal resonator and said high impedance input for converting the effect of said resonator on said first transistor from a series resonant circuit to a parallel resonant circuit.

6. A crystal controlled oscillator, as in claim 5, wherein said impedance inverting means comprises inductance means connected between said crystal resonator and said high impedance input and variable capacitance means connected across said high impedance input for varying the resonant frequency of said crystal resonator, said variable capacitance means having a capacitance value approximating the shunt capacitance of said crystal resonator.

7. A variable frequency crystal controlled oscillator, as in claim 6, wherein said variable capacitance means comprises a first varactor diode and a fixed capacitor connected in series, and frequency control voltage input means connected to the junction between said first varactor diode and said fixed capacitor for receiving a resonant frequency controlling voltage.

8. A variable frequency crystal controlled oscillator, as in claim 7, wherein said variable capacitance means additionally comprises a second varactor diode connected to said first varactor diode and temperature compensating voltage input means connected to the junction between said first and second varactor diodes for receiving a temperature compensating voltage.

9. A variable frequency crystal controlled oscillator, as in claim 6, further comprising a parallel resonant circuit resonant in the operating frequency range of said oscillator connected across said high impedance input, to suppress spurious frequency operation.

10. A variable frequency crystal controlled oscillator, as in claim 6, wherein said connection between said first transistor low impedance output and said second transistor low impedance input comprises a series resonant circuit to suppress spurious frequency operation.

* * * * *